United States Patent
Lee et al.

(10) Patent No.: US 7,515,462 B2
(45) Date of Patent: Apr. 7, 2009

(54) WRITING METHOD FOR MAGNETIC MEMORY CELL AND MAGNETIC MEMORY ARRAY STRUCTURE

(75) Inventors: Yuan-Jen Lee, Taipei County (TW); Ming-Jer Kao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 106 days.

(21) Appl. No.: 11/762,085

(22) Filed: Jun. 13, 2007

(65) Prior Publication Data
US 2008/0198648 A1 Aug. 21, 2008

(30) Foreign Application Priority Data
Feb. 16, 2007 (TW) ............................... 96106388 A

(51) Int. Cl.
*G11C 11/14* (2006.01)
(52) U.S. Cl. ...................... 365/171; 365/158
(58) Field of Classification Search ................. 365/171, 365/158
See application file for complete search history.

(56) References Cited

U.S. PATENT DOCUMENTS

| 6,335,890 | B1 | 1/2002 | Reohr et al. | |
| 6,545,906 | B1 | 4/2003 | Savtchenko et al. | |
| 6,633,498 | B1 | 10/2003 | Engel et al. | |
| 6,885,577 | B2 * | 4/2005 | Tang et al. | 365/158 |
| 7,075,807 | B2 * | 7/2006 | Leuschner et al. | 365/48 |
| 7,420,837 | B2 * | 9/2008 | Hung et al. | 365/158 |

\* cited by examiner

*Primary Examiner*—Tuan T. Nguyen
(74) *Attorney, Agent, or Firm*—Jianq Chyun IP Office

(57) ABSTRACT

A writing method for a magnetic memory cell which has a magnetic free stack layer with a bi-directional easy axis. A magnetic X axis and a magnetic Y axis are taken as reference directions, and the bi-directional easy axis is substantially on the magnetic X axis. The method includes applying a first magnetic field in a first direction of the magnetic Y axis. Then, a second magnetic field added onto the first magnetic field is applied in a first direction of the magnetic X axis. Next, the application of the first magnetic field is terminated. Thereafter, a third magnetic field is applied on the magnetic Y axis in a second direction opposite to the first direction. The second magnetic field is terminated and the third magnetic field is terminated.

18 Claims, 8 Drawing Sheets

US 7,515,462 B2

WRITING METHOD FOR MAGNETIC MEMORY CELL AND MAGNETIC MEMORY ARRAY STRUCTURE

CROSS-REFERENCE TO RELATED APPLICATION

This application claims the priority benefit of Taiwan application serial no. 96106388, filed Feb. 16, 2007. All disclosure of the Taiwan application is incorporated herein by reference.

BACKGROUND OF THE INVENTION

1. Field of the Invention

The present invention relates to a writing method for a magnetic memory cell and a magnetic memory array structure.

2. Description of Related Art

Magnetic memories, such as magnetic random access memories (MRAMs), are non-volatile memories combining attributes of non-volatility, high density, high read and write speed, radiation resistance, and so on. Through magnetization directions of magnetic materials in neighboring tunnel barrier layers, the magnitude of magneto-resistance arisen from parallel or anti-parallel orientation is determined, and data 0 or 1 can be stored in the MRAM cells. Writing data into a selected magnetic memory cell is generally accomplished by passing currents through two current lines e.g. a bit line (BL) and a write word line (WWL) which intersect at the selected magnetic memory cell and induce a magnetic field. Simultaneously, through adjusting the magnetization direction of a free layer, the magneto-resistance is changed. Besides, when recalling the stored data, the current flows into the selected magnetic memory cell unit, and the resistance of the cell is detected to determine the digital value of the stored data.

FIG. 1 depicts a basic structure of a magnetic memory cell. Please refer to FIG. 1. Transverse current lines 100 and 102 with an adequate current flowing there through are required for accessing the magnetic memory cell. The current lines 100 and 102 may be described as the WWL and the BL based on the operating manner, such that the memory cells in a two-dimensional array can be controlled, respectively.

As the currents flow into the two conductive lines, the magnetic field with two directions is generated. Thereby, the magnetic field having the desired magnitude and direction can be applied to a magnetic memory cell 104. The magnetic memory cell 104 has a stack-layered structure including a magnetic pinned layer having a fixed magnetization or a fixed total magnetic moment in a predetermined direction. The data can be recalled based on the magnitude of the magneto-resistance. In addition, the data stored in the memory cell can be read out through output electrodes 106 and 108. Other details of the magnetic memory will not be provided hereinafter as they may be deduced by those of ordinary skill in the art.

FIG. 2 depicts a memory mechanism of a magnetic memory. As shown in FIG. 2, a magnetic pinned layer 104a has a fixed magnetic moment direction 107. A magnetic free layer 104c is disposed over the magnetic pinned layer 104a and is isolated therefrom by a barrier layer 104b sandwiched in between. The magnetic free layer 104c has a magnetic moment direction 108a or 108b. Since the magnetic moment direction 107 is parallel to the magnetic moment direction 108a, the magneto-resistance generated thereby represents the data "0", for example. On the contrary, the magnetic moment direction 107 and the magnetic moment direction 108b are anti-parallel, and thus the magneto-resistance generated thereby refers to the data "1", for example.

In general, the single-layered magnetic free layer 104c as shown in FIG. 2 may give rise to access errors. In order to avert disturbance caused by the adjacent memory cells when the data are written, a triple-layered free layer with a ferromagnetic (FM) layer/non-magnetic (M) metal layer/ferromagnetic (FM) layer structure is conventionally adopted as a solution to replace the single-layered FM material and to form a magnetic free stack layer 166 whose structure is indicated in FIG. 3. Anti-parallel FM metal layers 150 and 154 are respectively disposed on and under an M metal layer 152, and thereby a confined magnetic line is constituted. An underlying magnetic pinned stack layer 168 is isolated from the magnetic free stack layer 166 by a tunnel barrier (T) layer 156. The magnetic pinned stack layer 168 includes a top pinned (TP) layer 158, an M metal layer 160, and a bottom pinned (BP) layer 162. The TP layer and the BP layer both have a fixed magnetization. In addition, a base layer 164 e.g. an antiferromagnetic layer is disposed at the bottom.

In the triple-layered magnetic free stack layer 166, a magnetic anisotropic axis i.e. an easy axis is inclined at an angle of 45 degree with respect to both the BL and the WWL. Thereby, the BL and the WWL are capable of sequentially applying a magnetic field to the free stack layer 166 at 45 degrees from the easy axis, so as to rotate the magnetization of the free stack layer 166. The data stored in the memory cell are determined by the two magnetization directions of the FM metal layer 154 and the BP layer 158.

Further, it has been proposed in the related art to rotate the magnetization of the free layer in a toggle mode operation other than replacing the free layer having the single-layered free layer with the free layer having the triple-layered structure. FIG. 4 depicts an effect induced by an applied magnetic field on a triple-layered structure. Referring to FIG. 4, a thick arrow represents the applied magnetic field, and the length of the thick arrow denotes the magnitude of said applied magnetic field. Two thin arrows refer to two magnetization directions of the top FM layer and the bottom FM layer in the free stack layer. As the applied magnetic field is subtle, the two magnetization directions remain unchanged. When the applied magnetic field is increased to a certain magnitude, the two magnetization directions form an opening angle. And, when the applied magnetic field is excessively large, the two magnetization directions are drawn to the same direction as that of the applied magnetic field. The toggle mode operation complies with the second condition described above.

FIG. 5 depicts a time sequence of an applied magnetic field in a toggle mode. Referring to FIG. 5, $H_1$ and $H_2$ represent two directions of the applied magnetic fields at a 45 degree angle with respect to a direction of the easy axis, while two arrows in an ellipse indicate the two magnetization directions. At a time $t_0$, the two magnetization directions are in the direction as the direction of the easy axis in the absence of the applied magnetic fields. Thereafter, $H_1$ and $H_2$ begin to rotate according to the time sequence illustrated in FIG. 5, and the total magnetic fields at different times ($t_1$~$t_3$) are obtained. The two magnetization directions are then rotated. At a time $t_4$, the application of the magnetic field is terminated. Here, the two magnetization directions are rotated once. That is to say, the data stored in the memory cell are modified through a write-in operation.

Moreover, since the write-in current is relatively high in the toggle mode operation, the related art has also brought up a bias field design. FIG. 6 is a schematic view depicting a reduction in an operating current according to the related art. Referring to the left graph in FIG. 6, the basic architecture of the memory cell is similar to that depicted in FIG. 3. The main difference lies in that a total magnetic moment 180 of the BP layer 162 is increased with respect to a total magnetic moment 182 of the TP layer 158. The total magnetic moment 180 is increased in thickness, for example. Since the total magnetic moments 180 and 182 are not balanced, a fringe magnetic field is generated, and a bias field 184 is applied to the free stack layer 166. Thereby, a toggle operating region in a first quadrant moves to a zero field, resulting in a small writing field 186. And because the required write-in magnetic field is small, the write-in current for generating the magnetic field can then be reduced.

The conventional operating modes have improved the write-in mechanism by which the data are written into the corresponding magnetic memory cell. However, the write-in method proposed by the related art can be merely performed on one magnetic memory cell, and the easy axis of the magnetic memory cell is pre-tilted in a 45 degree direction. Therefore, as the currents flow into the two write-in current lines, the direction of the magnetic field generated thereby is oriented at a 45 degree angle to the direction of the easy axis. If the direction of the easy axis is deflected during the fabrication of the magnetic memory cell, and if an excessive bias field is applied, some of the magnetic memory cells, in which the data stored not to be changed may be switched and may result in change. In view of the foregoing, optimizing the write-in efficiency and preventing an abnormal write-in operation are vital in the MRAM industry.

SUMMARY OF THE INVENTION

The present invention is directed to a magnetic memory array structure and a writing method for a magnetic memory cell, which can simultaneously change data stored in a plurality of the magnetic memory cells and avoid other magnetic memory cells from being affected and losing the stored data.

The present invention is directed to a magnetic memory array structure and a writing method for a magnetic memory cell, which can simultaneously operate a plurality of the magnetic memory cells in a same cell column. Here, a write-in magnetic field is applied to the magnetic memory cell in which the stored data are to be changed, while another write-in magnetic field is applied to the magnetic memory cell in which the stored data are not to be changed, so as to prevent the stored data from being altered by disturbance arisen from adjacent magnetic memory cells.

The present invention provides a writing method for a magnetic memory cell which has a magnetic free stack layer with a bi-directional easy axis. A magnetic X axis and a magnetic Y axis are taken as reference directions, and the bi-directional axis is substantially on the magnetic X axis. The method includes applying a first magnetic field in a first direction of the magnetic Y axis. Then, a second magnetic field in addition to the first magnetic field is applied in a first direction of the magnetic X axis. Next, the application of the first magnetic field is terminated. Thereafter, a third magnetic field is applied on the magnetic Y axis in a second direction opposite to the first direction. The second magnetic field is terminated and the third magnetic field is terminated.

The present invention further provides a writing method for a magnetic memory cell. Here, a plurality of the magnetic memory cells constitutes a two-dimensional array structure in a direction of a magnetic X axis and a direction of a magnetic Y axis. Each of the magnetic memory cells has a bi-directional easy axis that is substantially on the magnetic X axis, and the array structure includes at least a cell column and at least two cell rows. The method includes applying a first magnetic field to each of the magnetic memory cells on the cell column, and the first magnetic field is in a first direction of the magnetic Y axis. Moreover, a second magnetic field is applied to each of the magnetic memory cells on the cell row. The second magnetic field is in a first direction of the magnetic X axis and is added onto the first magnetic field. Then, the termination of applying the first magnetic field is performed on the corresponding memory cell in which stored data are to be changed. Next, a third magnetic field is applied on the magnetic Y axis in a second direction opposite to the first direction. For the corresponding memory cell in which the stored data are not to be changed, the first magnetic field is continuously applied thereto, or a fourth magnetic field is then applied on the magnetic Y axis in a same direction as the first direction after a period of termination. Thereafter, the application of the second magnetic field is terminated. After that, the applications of the remaining third magnetic field and the first magnetic field or the fourth magnetic field are terminated.

The present invention further provides a magnetic memory array structure including a plurality of magnetic memory cells constituting a two-dimensional array structure in a direction of a magnetic X axis and a direction of a magnetic Y axis. Here, each of the magnetic memory cells has a magnetic free stack layer with a bi-directional easy axis that is substantially on the magnetic X axis. The array structure includes at least a cell column and at least two cell rows. At least a first current line is also included in the array structure to connect all the magnetic memory cells on the cell column, such that a magnetic field X can be provided on the magnetic X axis. At least two second current lines are also included in the array structure to connect all the magnetic memory cells on said cell rows, respectively, such that a magnetic field Y can be provided on the magnetic X axis. Here, the second current lines respectively input a corresponding magnetic field waveform based on a predetermined time sequence to drive the memory cells on the cell column, and data stored in each of the memory cells are changed or not changed based on actual demands.

In order to the make the aforementioned and other objects, features and advantages of the present invention comprehensible, several embodiments accompanied with figures are described in detail below.

DESCRIPTION OF EMBODIMENTS

A writing method for a magnetic memory cell provided by the present invention is capable of preventing other memory cells from being affected when data are written into the magnetic memory cell. Moreover, the present invention allows a simultaneous operation on a plurality of the memory cells. For example, a plurality of binary data can be simultaneously written into the corresponding memory cells based on actual demands.

Figure 1:
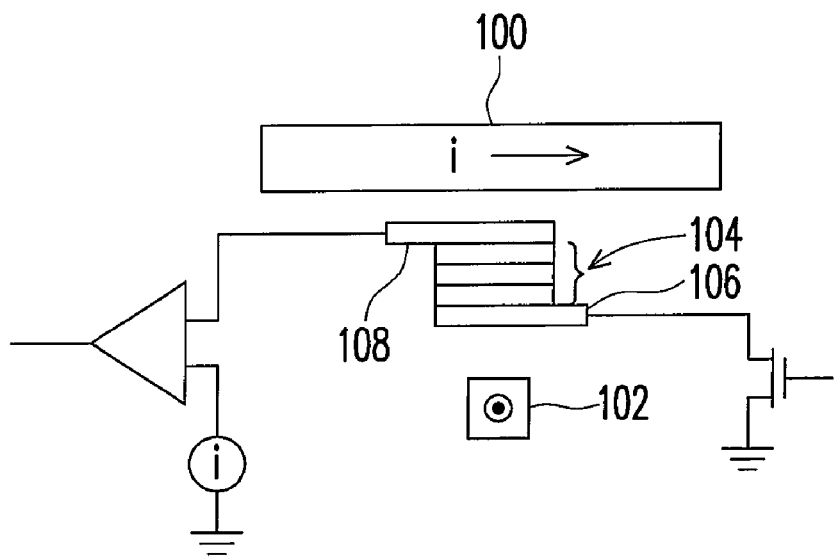
FIG. 1 depicts a basic structure of a magnetic memory cell.
Figure 2:
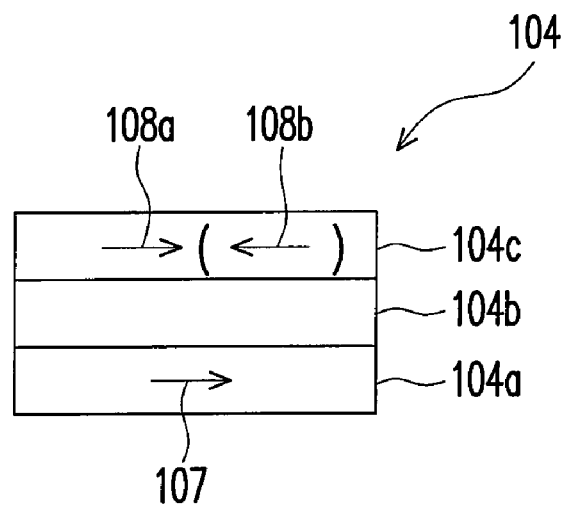
FIG. 2 depicts a memory mechanism of a magnetic memory.
Figure 3:
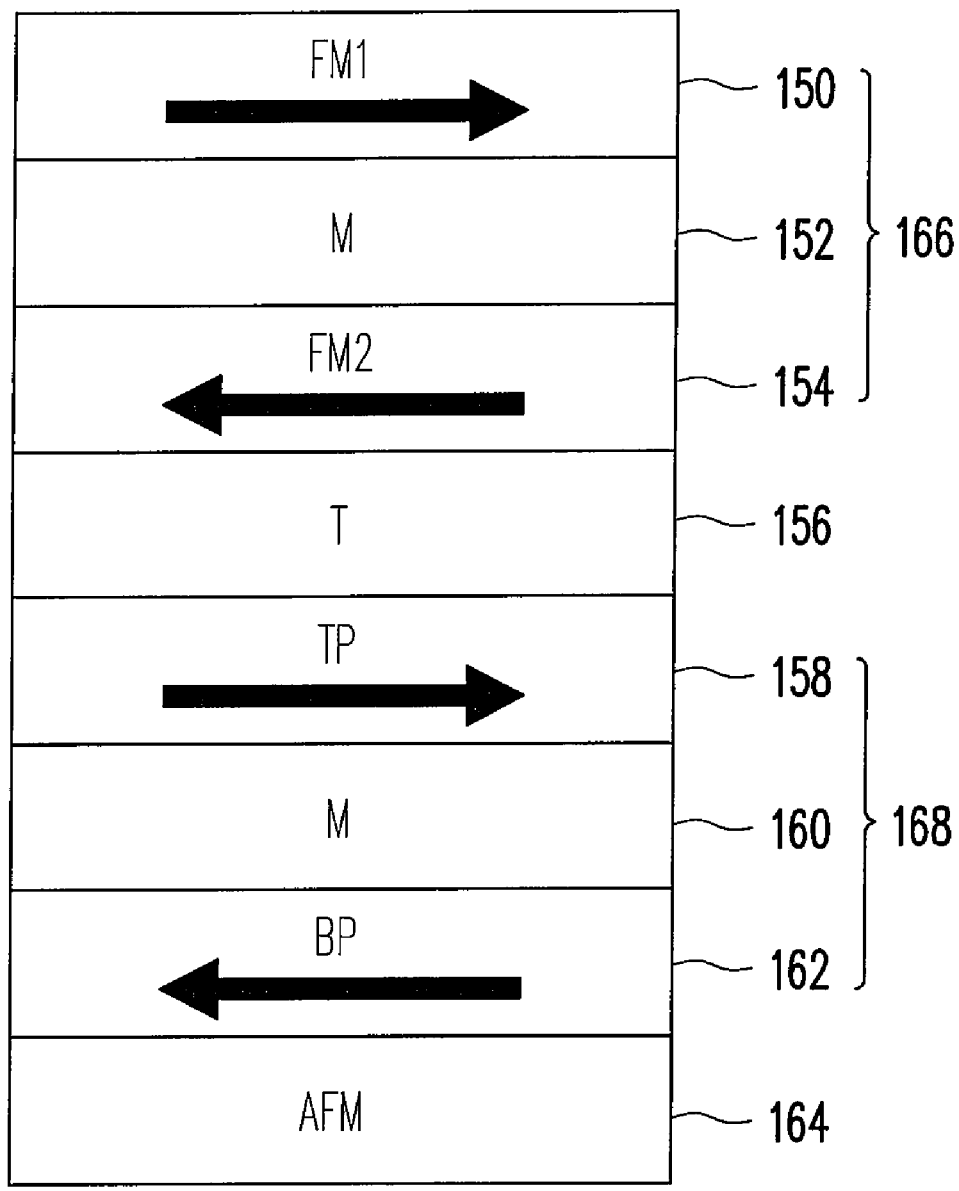
FIG. 3 is a cross-sectional schematic view depicting a structure of a conventional magnetic memory cell.
Figure 4:
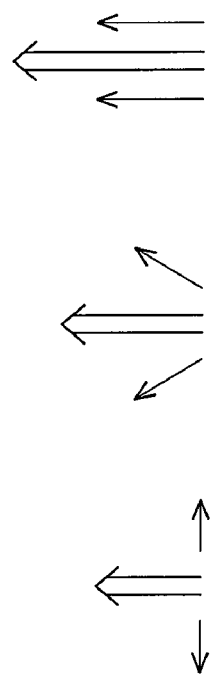
FIG. 4 depicts an effect induced by an applied magnetic field on a triple-layered structure.
Figure 5:
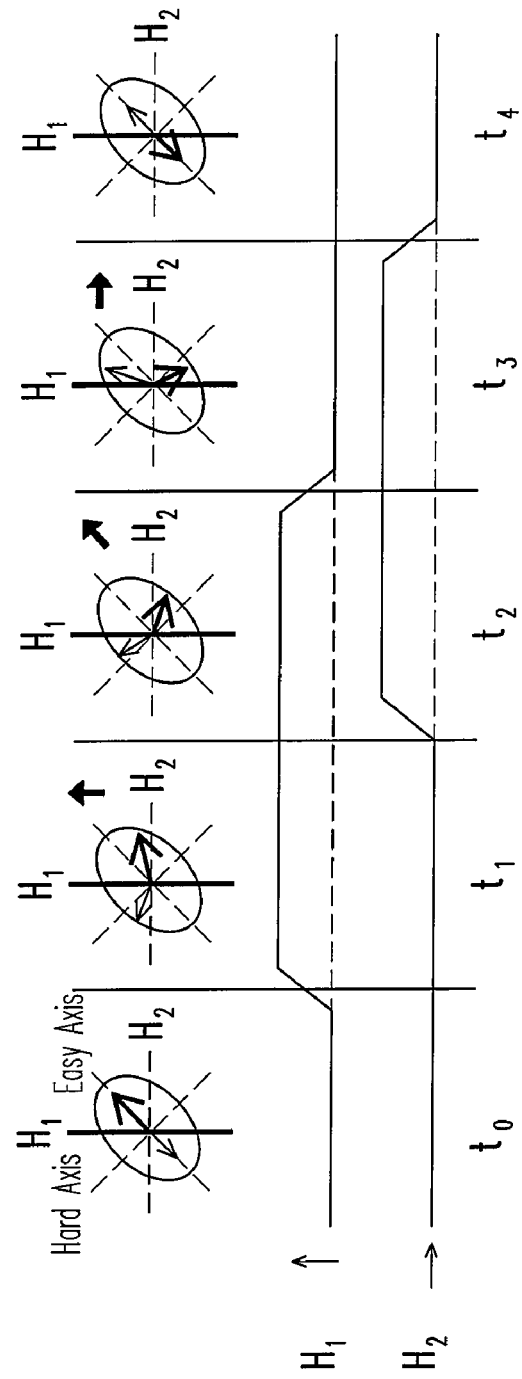
FIG. 5 depicts a time sequence of an applied magnetic field in a toggle mode.
Figure 6:
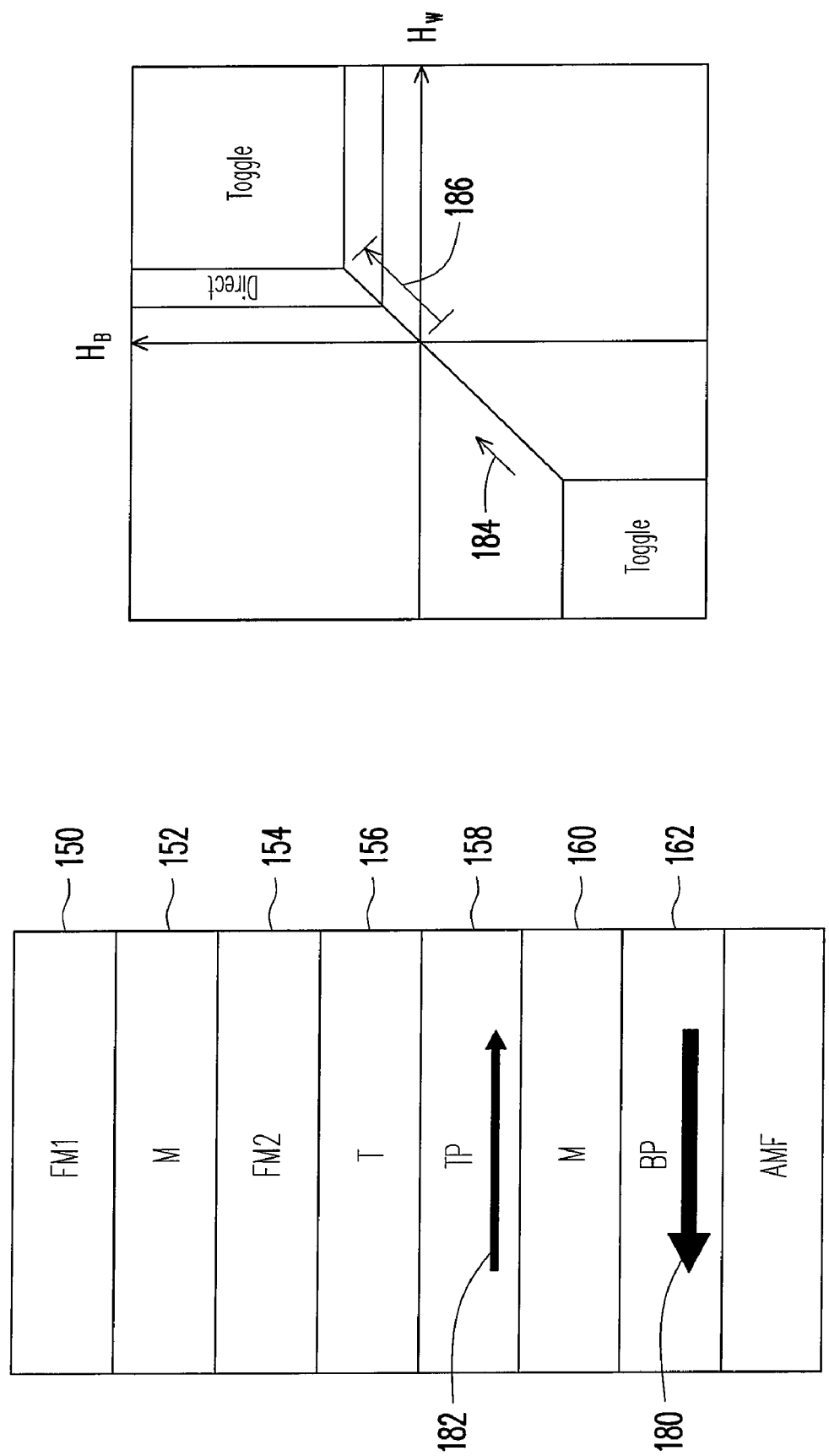
FIG. 6 is a schematic view depicting a reduction in an operating current according to the related art.
Figure 7:
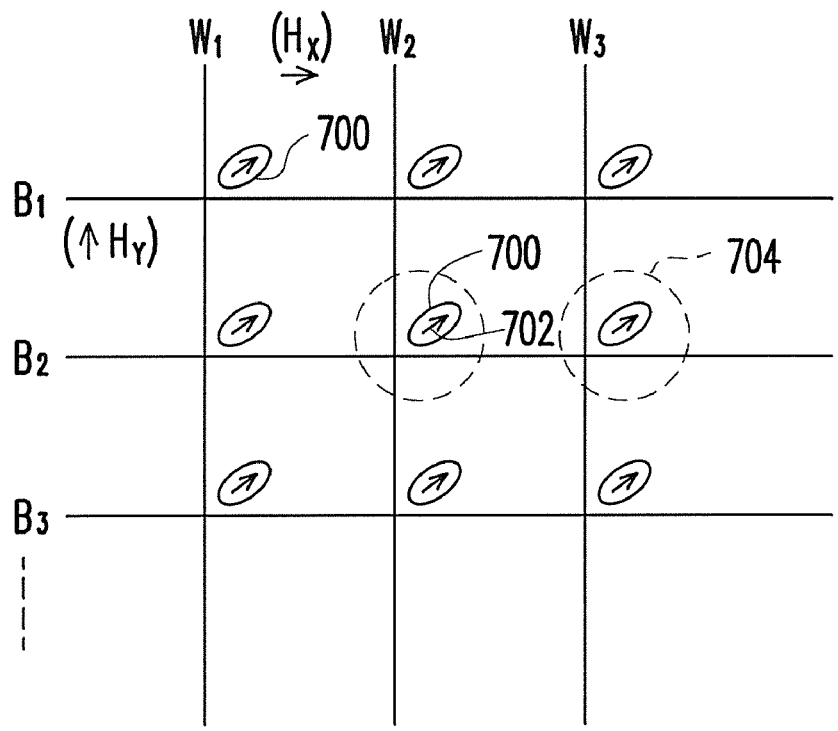
FIG. 7 is a schematic view depicting an array structure in a conventional toggle mode operation.

In the present invention, a further research on the conventional toggle-MRAM reveals that the data stored in the memory cells not to be operated may be modified unexpectedly on account of disturbance caused by a write-in magnetic field if a bias field illustrated in FIG. 6 is excessively increased, which gives rise to data errors. FIG. 7 is a schematic view depicting an array structure in a conventional toggle mode operation. B1, B2, B3, etc and W1, W2, W3, etc refer to operating current lines in two directions, respectively. For example, the current lines W1, W2, W3, etc generate a magnetic field Hx on an X axis, while the current lines B1, B2, B3, etc generate a magnetic field Hy on an Y axis. In addition, the directions of the currents determine whether the direction of the magnetic X axis and the direction of the magnetic Y axis are positive or negative.

In a memory cell array, each memory cell 700 has a bi-directional easy axis (i.e. a long axis) at a 45 degree angle to a direction of the magnetic field. Besides, as shown by arrows depicted in FIG. 7, each of the memory cells 700 also includes a bias field 702, ideally parallel to the bi-directional easy axis. For example, when the data are written into the memory cell 700 at which the current lines W2 and B2 intersect, all of the memory cells connecting the current lines W2 and B2 are disturbed, and a memory cell 704 may be affected by the magnetic field generated by the current line B2.

Figure 8:
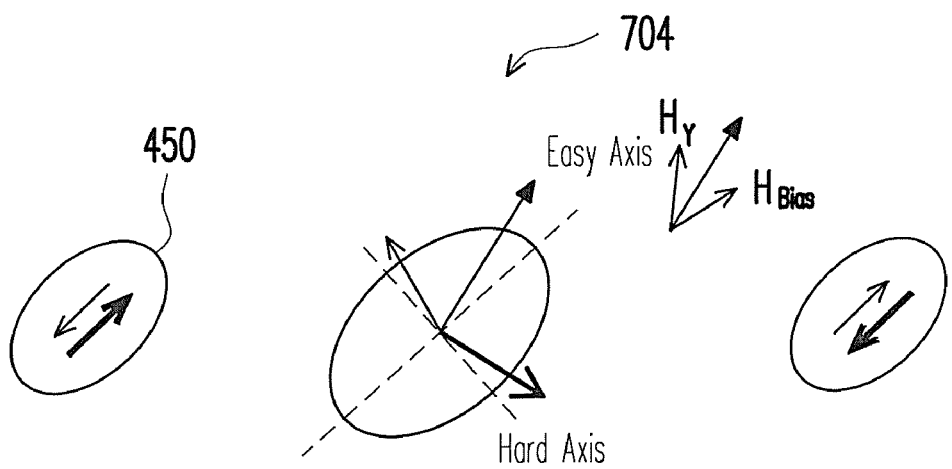
FIG. 8 is a schematic view depicting possible data storage errors arisen from disturbance in a conventional toggle mode operation.

FIG. 8 is a schematic view depicting possible data storage errors arisen from disturbance in a conventional toggle mode operation. Referring to FIG. 8, due to variations in manufacturing conditions, the direction of the easy axis in the memory cell 704 may be deflected, for example. On account of the impact arisen from the magnetic field Hy and the bias field $H_{Bias}$, the two parallel magnetization directions on a magnetic free stack layer 450 are then rotated, and a balanced opening angle is then obtained. Although only the magnetic field Hy generated by the current line B2 is applied, the rotation is beyond a hard axis due to an undesired position of the easy axis. As the magnetic field Hy disappears, the magnetization of the magnetic free stack layer is reversed, unexpectedly modifying the data and causing the data storage errors.

The aforesaid situation is one of the reasons resulting in the data errors. The present invention thus brings forth another operating method after the drawbacks of the conventional operating methods are discussed. It will be illustrated through the following embodiments, but the present invention is not limited to the embodiments elaborated hereinafter.

Figure 9:
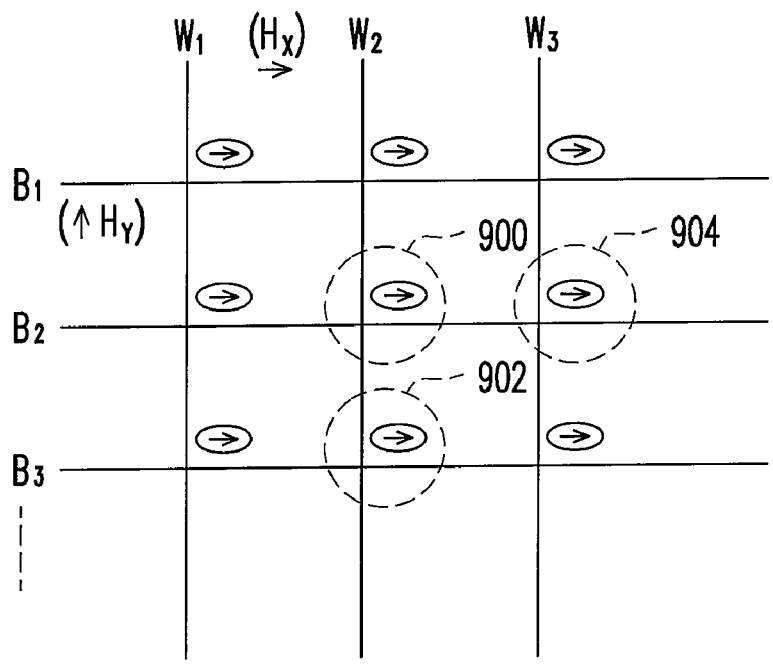
FIG. 9 is a schematic view depicting a magnetic memory array structure according to one embodiment of the present invention.

FIG. 9 is a schematic view depicting a magnetic memory array structure according to one embodiment of the present invention. Referring to FIG. 9, magnetic memory cells in the present embodiment of the present invention are oriented in a two-dimensional array according to the arrangement of the current lines W1, W2, W3, etc and the current lines B1, B2, B3, etc. The magnetic memory cells can also be oriented in cell columns and cell rows. For example, a magnetic field Hx generated by a magnetic X axis corresponding to the current lines W1, W2, W3, etc and a magnetic field Hy generated by a magnetic Y axis corresponding to the current lines B1, B2, B3, etc are taken as two reference directions. An easy axis of the magnetic memory cell provided in the present embodiment is substantially parallel to one of the two orthogonal magnetic axes. For example, the easy axis is substantially in a direction of the magnetic X axis. In other words, the direction of the magnetic X axis is defined as a direction substantially parallel to the easy axis. Moreover, the memory cell may include a bias field as shown by arrows in FIG. 9. It should be noted that the term "substantially" allows a possible slight difference instead of being absolutely equal in the present embodiment.

Figure 10:
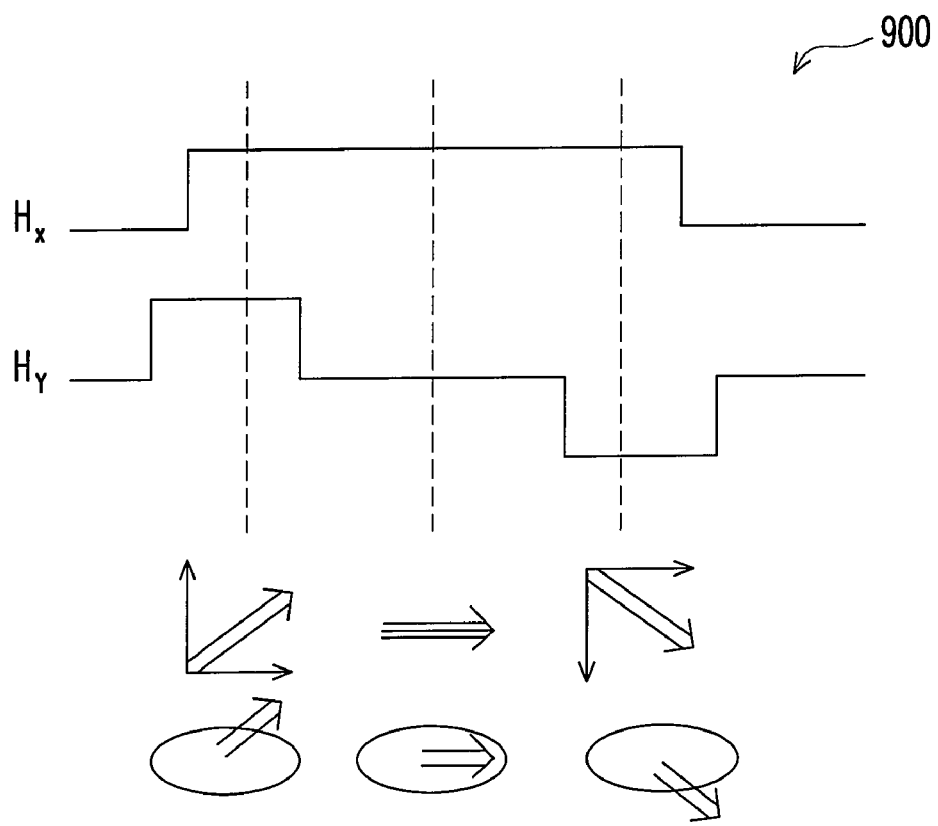
FIG. 10 is a schematic view depicting a time sequence of a write-in magnetic field waveform according to one embodiment of the present invention.

A magnetic memory cell 900 is further taken for an example, and the data stored therein are to be written or changed. FIG. 10 is a schematic view depicting a time sequence of a write-in magnetic field waveform according to one embodiment of the present invention. Referring to FIG. 10, the operation of the magnetic memory cell 900 is controlled by current lines W2 and B2. Namely, a component of magnetic field Hx is generated by the current line W2 while the component of magnetic field Hy is generated by the current line B2. Since easy axes of all the magnetic memory cells are substantially parallel to a magnetic X axis, it is required to properly arrange write-in magnetic waveforms based on a toggle switching mode, so as to switch data stored in the magnetic memory cell 900 and to reach three states as illustrated in FIG. 10.

With the strength of the currents flowing through the current lines B2 and W2, the magnitude of the components of the magnetic fields Hx and Hy may be determined. The components may be identical to or different from each other, while the directions of the magnetic fields require an appropriate control, so as to generate a desired total magnetic field. In general, the magnetic field Hy is applied first. For example, the magnetic field Hy generated in a positive Y-direction. The magnetic field Hx is then applied, such that the desired total magnetic field required by a first stage is obtained. The direction of the magnetic field is in a first quadrant, for example. Next, at a second stage, the application of the magnetic field Hy is terminated, and therefore only the magnetic field Hx remains. The total magnetic field is the magnetic field Hx, for example. Thereafter, a negative magnetic field Hy is applied to the memory cell 900, and the total magnetic field in a fourth quadrant is acquired. At the three stages, the direction of the magnetic field with respect to the direction of the easy axis is rotated, and thus the data can be written or switched. Eternally, the applications of the magnetic fields Hx and Hy are terminated, and the original state in the absence of any applied magnetic field resumes. Although the terminations of applying the magnetic fields Hx and Hy need not be in sequence, it is preferred to stop the magnetic field Hx and then stop the magnetic field Hy, so as to ensure data security.

Note that the structure of the aforesaid memory cell may include a magnetic free stack layer as well as a bias field design. In addition, the same effect can be reached by creating the magnetic field waveforms of Hx and Hy in FIG. 10 in the negative direction. Namely, the magnetic field Hx is in the negative direction, while the magnetic field Hy is in the negative direction at the first stage and in the positive direction at the third stage.

In the two-dimensional array structure, the magnetic field waveform corresponding to the magnetic field Hy can be simultaneously inputted into other memory cells in the cell column on the current line W2, given that writing or switching the data is required. That is to say, the present embodiment allows the write-in operation or the switching operation to be performed on a plurality of the memory cells at the same time.

The current lines B2 and W2 may also disturb other memory cells in which the data are not to be written or switched, such as memory cells 902 and 904. Here, since the memory cell 902 detects the magnetic field Hx generated by the current line W2, the data errors arisen from disturbance easily occur. By contrast, the memory cell 904 which detects the magnetic field Hy generated by the current line B2 is relatively not apt to be disturbed, and thus the data can be maintained.

Figure 11:
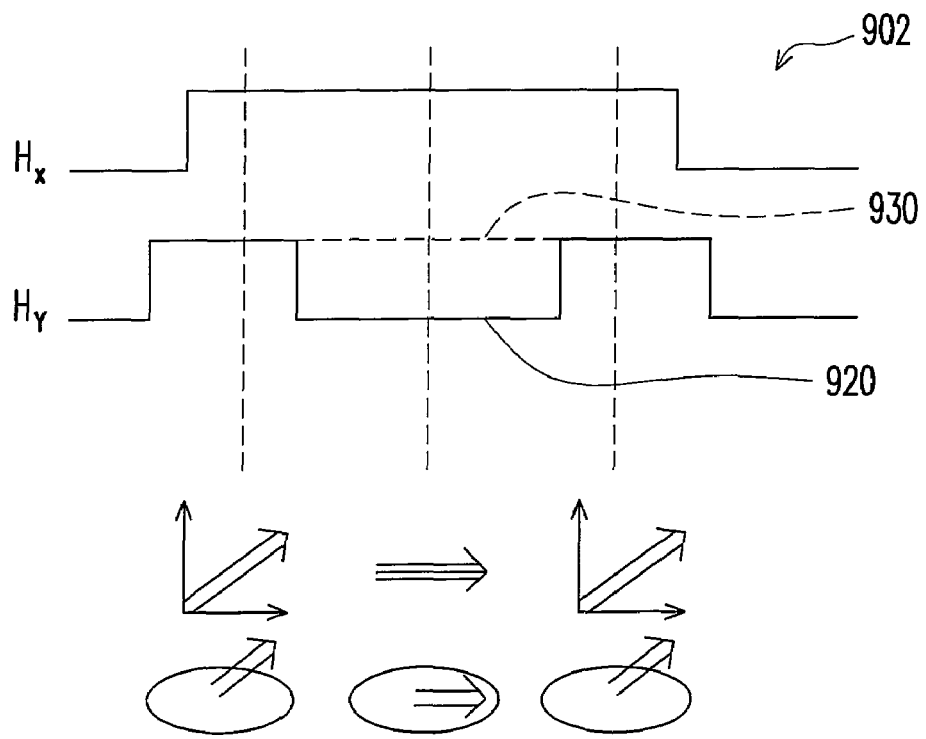
FIG. 11 is a schematic view depicting a time sequence of a non-write-in magnetic field waveform according to one embodiment of the present invention.

In order to prevent the data errors caused by disturbance, the memory cells in which the data are not to be written or switched in the same cell column (e.g. the memory cell 902) and the corresponding current line (e.g. the current line B3) are simultaneously initiated while the different magnetic field waveforms are inputted. FIG. 11 is a schematic view depicting a time sequence of a non-write-in magnetic field waveform according to one embodiment of the present invention. Please refer to FIG. 11. In comparison with the time sequence of the magnetic field waveform depicted in FIG. 10, the direction of the magnetic field Hy at the third stage is identical to that at the first stage. On the other hand, the magnitude of the magnetic field can be equal or different at different stages, which is determined upon actual demands. Thereby, it can be ensured that the data stored in the memory cell 902 remain unchanged.

Figure 13:
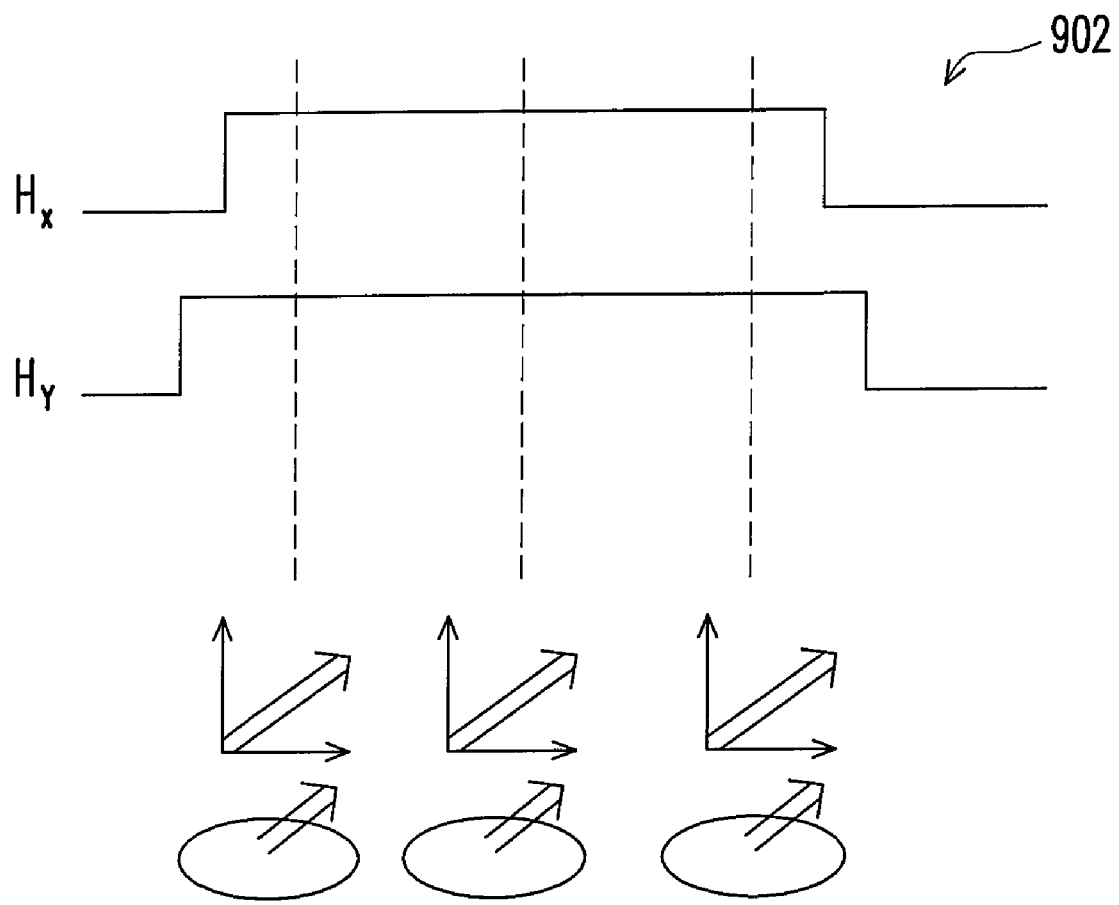
FIG. 13 is a schematic view depicting a time sequence of still another non-write-in magnetic field waveform according to one embodiment of the present invention.

However, the aforesaid operating method for the memory cells in which the data are not to be written is not the only option. For example, in a period 930, the magnetic field can stay the same. The mechanism can be referred to as in FIG. 13. Particularly, the application of the initial magnetic field Hy can be terminated after the application of the magnetic field Hx is stopped on the premise of a simplified operation. Since the magnetic field is also applied to the memory cell 902 in which the data are not written, it can be further ensured that the data errors arisen from disturbance of other magnetic fields do not occur.

Figure 12:
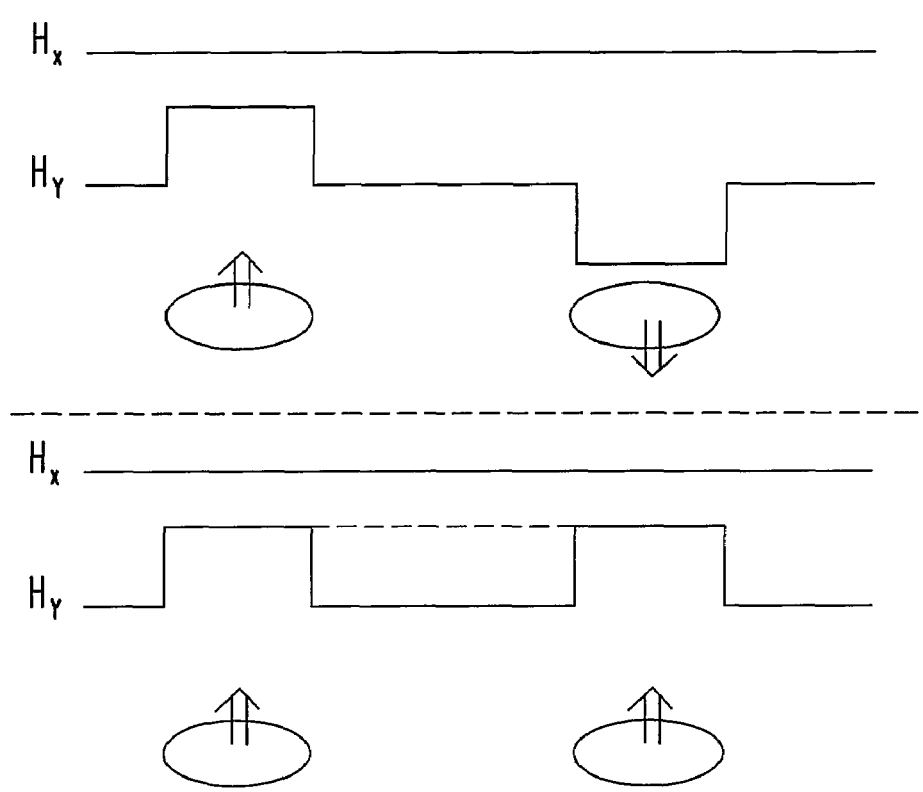
FIG. 12 is a schematic view depicting a time sequence of another non-write-in magnetic field waveform according to one embodiment of the present invention.

FIG. 12 is a schematic view depicting a time sequence of still another non-write-in magnetic field waveform according to one embodiment of the present invention. Referring to FIG. 12 (the upper graph therein), the memory cell 904 merely detects the magnetic field Hy of FIG. 10 but not the magnetic field Hx thereof, and thus the value of the magnetic field Hx is zero. Since the detected magnetic field is in the direction of the magnetic Y axis, the data errors in the memory cell 904 do not occur. Likewise, if the memory cell 904 may merely detect the magnetic field Hy of FIG. 11 but not the magnetic field Hx thereof, the data errors in the memory cell 904 do not occur as well. Based on the above, the present invention can certainly reduce the data errors.

Besides, according to the magnetic memory array structure disclosed in the present invention, all the memory cells in the same cell column can be initiated at the same time, and the magnetic field waveforms representing the writing/switching operation or the non-writing/non-switching operation are respectively inputted. Accordingly, the present invention is able to operate a plurality of the binary memory cells as a whole rather than individually operate each memory cell unit. The current lines B1, B2, B3, etc can all be initiated by one driver at the same time. For example, 8-bit or 16-bit memory cells in the same cell column but in the different cell rows may be grouped and operated simultaneously, which meets the requirement for an access to mass data in the future.

Although the toggle switching mechanism is also proposed in the present invention, the arrangement of the arrays and the orientation of the direction of the easy axis in conformity with the free stack layer enable the data to be written in an effective manner. In addition, the data stored in other memory cells are not modified, which reduces the error rate of data storage.

The present invention is further directed to a method for grouping a plurality of the memory cells to access the data as a whole, which achieves a better operating speed.

Although the present invention has been disclosed above by the preferred embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A writing method for a magnetic memory cell having a magnetic free stack layer with a bi-directional easy axis, wherein a magnetic X axis and a magnetic Y axis are taken as reference directions, and the bi-directional easy axis is substantially on the magnetic X axis, the method comprising:
    applying a first magnetic field on a first direction of the magnetic Y axis;
    applying a second magnetic field on a first direction of the magnetic X axis, wherein the second magnetic field is added onto the first magnetic field;
    terminating the first magnetic field;
    applying a third magnetic field on the magnetic Y axis in a second direction opposite to the first direction;
    terminating the second magnetic field; and
    terminating the third magnetic field.

2. The writing method for the magnetic memory cell as claimed in claim 1, wherein the step of applying the first magnetic field is earlier than the step of applying the second magnetic field.

3. The writing method for the magnetic memory cell as claimed in claim 1, wherein the step of terminating the second magnetic field is earlier than the step of terminating the third magnetic field.

4. The writing method for the magnetic memory cell as claimed in claim 1, wherein the first direction of the magnetic Y axis is a positive direction or a negative direction of the magnetic Y axis.

5. The writing method for the magnetic memory cell as claimed in claim 4, wherein the first direction of the magnetic X axis is a positive direction or a negative direction of the magnetic X axis.

6. A writing method for a magnetic memory cell, wherein a plurality of the magnetic memory cells constitutes a two-dimensional array structure in a direction of a magnetic X axis and a direction of a magnetic Y axis, and each of the magnetic memory cells has a bi-directional easy axis substantially on the magnetic X axis, the array structure comprising at least a cell column and at least two cell rows, the method comprising:
    applying a first magnetic field to each of the magnetic memory cells on the cell column, wherein the first magnetic field is in a first direction of the magnetic Y axis;

applying a second magnetic field to each of the magnetic memory cells on the cell row, wherein the second magnetic field is in a first direction of the magnetic X axis, and the second magnetic field is added on the first magnetic field;

performing a process on the corresponding memory cell in which stored data are to be changed, the process comprising:

terminating the first magnetic field; and applying a third magnetic field on the magnetic Y axis in a second direction opposite to the first direction;

performing a process on the corresponding memory cell in which the stored data are not to be changed, the process comprising:

continuously applying the first magnetic field, or applying a fourth magnetic field after a period of time on the magnetic Y axis in a same direction as the first direction;

terminating the second magnetic field; and terminating the remaining third magnetic field and the first magnetic field or the fourth magnetic field.

7. The writing method for the magnetic memory cell as claimed in claim 6, wherein the step of applying the first magnetic field is earlier than the step of applying the second magnetic field.

8. The writing method for the magnetic memory cell as claimed in claim 6, wherein the step of terminating the second magnetic field is earlier than the step of terminating the third magnetic field and the first magnetic field or the fourth magnetic field.

9. The writing method for the magnetic memory cell as claimed in claim 6, wherein the first direction of the magnetic Y axis is a positive direction or a negative direction of the magnetic Y axis.

10. The writing method for the magnetic memory cell as claimed in claim 6, wherein the first direction of the magnetic X axis is a positive direction or a negative direction of the magnetic X axis.

11. A magnetic memory array structure, comprising:

a plurality of magnetic memory cells constituting a two-dimensional array structure in a direction of a magnetic X axis and a direction of a magnetic Y axis, wherein each of the magnetic memory cells has a magnetic free stack layer with a bi-directional easy axis substantially on the magnetic X axis, and the array structure comprises at least a cell column and at least two cell rows;

at least a first current line connecting all the magnetic memory cells on the cell column, so as to provide a magnetic field X on the magnetic X axis; and at least two second current lines connecting all the magnetic memory cells on said cell rows, respectively, so as to provide a magnetic field Y on the magnetic X axis, wherein the second current lines respectively input a corresponding magnetic field waveform based on a predetermined time sequence to drive the memory cells on the cell column, and data stored in each of the memory cells are changed or not changed based on actual demands.

12. The magnetic memory array structure as claimed in claim 11, wherein the magnetic field waveform of the memory cell in which the stored data are to be changed comprises:

applying a first magnetic field on a first direction of the magnetic Y axis;

applying a second magnetic field on a first direction of the magnetic X axis, wherein the second magnetic field is added onto the first magnetic field;

terminating the first magnetic field;

applying a third magnetic field on the magnetic Y axis in a second direction opposite to the first direction;

terminating the second magnetic field; and terminating the third magnetic field.

13. The magnetic memory array structure as claimed in claim 12, wherein the step of applying the first magnetic field is earlier than the step of applying the second magnetic field.

14. The magnetic memory array structure as claimed in claim 12, wherein a magnetic field waveform of the memory cell in which the stored data are not to be changed comprises:

applying a fourth magnetic field on the magnetic Y axis in a same direction as the first direction to the memory cell in which the stored data are not to be changed while the third magnetic field is applied.

15. The magnetic memory array structure as claimed in claim 14, wherein the step of terminating the second magnetic field is earlier than the step of terminating the third magnetic field and/or the termination of applying the fourth magnetic field.

16. The magnetic memory array structure as claimed in claim 12, wherein a magnetic field waveform of the memory cell in which the stored data are not to be changed comprises:

after applying the second magnetic field, continuously applying the first magnetic field until the second magnetic field is terminated.

17. The magnetic memory array structure as claimed in claim 12, wherein the first direction of the magnetic Y axis is a positive direction or a negative direction of the magnetic Y axis.

18. The writing method for the magnetic memory cell as claimed in claim 12, wherein the first direction of the magnetic X axis is a positive direction or a negative direction of the magnetic X axis.

* * * * *